US009704817B2

(12) United States Patent
Knowles et al.

(10) Patent No.: US 9,704,817 B2
(45) Date of Patent: Jul. 11, 2017

(54) INTEGRATED LASER AUTO-DESTRUCT SYSTEM FOR ELECTRONIC COMPONENTS

(75) Inventors: Gareth J. Knowles, Willimasport, PA (US); Lindsay Quarrie, Socorro, NM (US)

(73) Assignee: QorTek, Inc., Williamsport, PA (US)

( * ) Notice: Subject to any disclaimer, the term of this patent is extended or adjusted under 35 U.S.C. 154(b) by 1794 days.

(21) Appl. No.: 12/205,693

(22) Filed: Sep. 5, 2008

(65) Prior Publication Data

US 2009/0070887 A1    Mar. 12, 2009

Related U.S. Application Data

(60) Provisional application No. 60/970,361, filed on Sep. 6, 2007.

(51) Int. Cl.
| | |
|---|---|
| *G06F 1/26* | (2006.01) |
| *G06F 11/00* | (2006.01) |
| *G08B 13/00* | (2006.01) |
| *G08B 21/00* | (2006.01) |
| *G08B 29/00* | (2006.01) |
| *H01L 23/00* | (2006.01) |
| *H05K 1/02* | (2006.01) |
| *H01S 5/02* | (2006.01) |
| *H01S 5/40* | (2006.01) |

(52) U.S. Cl.
CPC ......... *H01L 23/576* (2013.01); *H05K 1/0274* (2013.01); *H05K 1/0275* (2013.01); *H01L 2924/0002* (2013.01); *H01S 5/02* (2013.01); *H01S 5/4025* (2013.01); *H05K 2201/10121* (2013.01); *H05K 2201/10151* (2013.01); *H05K 2201/10689* (2013.01); *H05K 2203/178* (2013.01)

(58) Field of Classification Search
CPC .......... G06F 21/86; G06F 21/70; G06F 21/87; G06F 21/88; G06F 21/71
USPC ........................................................ 726/34
See application file for complete search history.

(56) References Cited

U.S. PATENT DOCUMENTS

| | | | |
|---|---|---|---|
| 5,736,777 | A | 4/1998 | Shield et al. |
| 5,880,523 | A | 3/1999 | Candelore |
| 5,956,415 | A * | 9/1999 | McCalley et al. ............ 382/124 |
| 5,998,858 | A | 12/1999 | Little et al. |
| 6,344,679 | B1 | 2/2002 | Klaasen et al. |
| 6,926,204 | B2 | 8/2005 | Vacherand et al. |
| 6,970,360 | B2 | 11/2005 | Sinha |
| 7,122,899 | B2 | 10/2006 | Lippmann et al. |
| 7,180,008 | B2 | 2/2007 | Heitmann et al. |

(Continued)

*Primary Examiner* — Kambiz Zand
*Assistant Examiner* — Stephen Sanders
(74) *Attorney, Agent, or Firm* — Cahn & Samuels, LLP

(57) ABSTRACT

An apparatus, method and system for securing proprietary semiconductor IC components including a target semiconductor IC; at least one laser diode array disposed adjacent to the target semiconductor IC and coupled thereto; a power supply coupled to the at least one laser diode array; a sensor for sensing a predetermined parameter operatively coupled to the laser diode array through the power supply; wherein the sensor detects the existence of a predetermined event and as a result of the detection of the predetermined event activates the power supply and energizes the laser diode array, causing the laser diode array to project focused laser energy into the target semiconductor IC, damaging the target semiconductor IC.

25 Claims, 7 Drawing Sheets

(56) References Cited

U.S. PATENT DOCUMENTS

2005/0021468 A1* 1/2005 Stockton ..................... 705/51
2005/0100077 A1* 5/2005 Rosen et al. ................ 375/130
2005/0110091 A1* 5/2005 Yamazaki et al. ........... 257/347

* cited by examiner

INTEGRATED LASER AUTO-DESTRUCT SYSTEM FOR ELECTRONIC COMPONENTS

This nonprovisional application claims priority based upon the prior U.S. Provisional Patent Application entitled "Integrated Laser Auto-destruct System for Electronic Components," Ser. No. 60/970,361, filed Sep. 6, 2007, in the names of Gareth Knowles and Lindsay Quarrie.

I. FIELD OF THE INVENTION

This invention relates in general to the field of ASIC anti-tamper apparatus and in particular to apparatus, system and methods for destroying semiconductor materials and microelectronic devices to prevent reverse engineering.

II. DESCRIPTION OF THE PRIOR ART

In today's competitive world the economic and military advantages of being able to reverse engineer a competitor or opponent's technology have grown exponentially. At the heart of nearly every commercial and military electronics system, ASICs, FPGAs and other microelectronics contain a substantial portion of the added value within the system. Since the key security and/or vendor intellectual property (IP) is often resident within its logic or memory, these form many of the more likely components that a marketplace competitor or military adversary would attempt to inspect and reverse engineer. As such it has become increasingly critical that these components be protected.

With the advent of international commerce and the recent concerns regarding the exportation of sensitive electronics, one of the more practical approaches to protect the contents of these components is through their destruction upon the detection of an unauthorized act or an event that may compromise the integrity of the contents of these components. These contingencies may range from the unauthorized opening of a box containing the sensitive ICs or attempting to remove a chip from a card, to an event indicating that the pilot of a plane containing the sensitive ICs has ejected, or exposure of the system, box or card to water.

Methods to prevent tampering and or reverse engineering through chip destruction have largely been restricted to tamper detection and rely on traditional methods to destroy or damage a chip to prevent reverse engineering. Generally destruction methods have been restricted to the use of energetic materials (explosives or corrosives), which present serious handling and safety issues, or through non-energetic methods. Non-energetic methods typically use some type of electrical energy (electrical short) directed through the circuitry of the target chip to short out the sensitive circuitry of the target chip or other method to physically shatter the chip. A drawback to such approaches is that they generally require significant power to destroy the chip to the degree necessary to prevent reverse engineering, and are therefore vulnerable to defeat through restriction of the available power.

The use of energetic materials such as explosives or corrosives or other chemicals to damage or destroy a target chip raise both serious handling and safety issues from supply chain vendors, and uncertainty as to effectiveness in all conditions where they can potentially be nullified, if such anti-tamper techniques are known to been added.

U.S. Pat. No. 5,880,523 discloses an anti-tamper integrated circuit (IC) apparatus that is adapted for use with an IC that carries an active component, such as a secure processor, which requires a constant power signal to operate. If the power signal is interrupted, data is erased from a volatile memory of the secure processor. The memory is located within the IC package. An external power signal is coupled to the memory via a conductive path which is carried outside the housing and which may be embedded in a decoder board, micro-module substrate, or smart card body in which the IC is carried. The conductive path may carry the power signal directly to the memory, or it may carry the power signal to bias a transistor. Removal of the IC package from the decoder board, micro-module substrate or smart card, will open the conductive path and interrupt the power signal to the memory by causing a short circuit or an open circuit. As a result, the data stored in the memory will be lost.

U.S. Pat. No. 5,736,777 discloses a method and apparatus for fast electronic self-destruction of a CMOS integrated circuit. The disclosed apparatus electrically destroys devices containing semiconductor components, securing the components from inspection by detecting the initiation of an attempt to inspect the component and, responsive thereto, electrically destroying the component. A switchable pad having a destruct state and an operating state may be connected to a well or to the substrate of the semiconductor device. When in destruct state, the switchable pad drives the voltage of the well or substrate to a voltage that induces latch-up of the semiconductor device, allowing very large currents to flow through active or passive elements fabricated on the surface of the semiconductor device.

U.S. Pat. No. 5,998,858 discloses a secure electronic data module containing a monolithic semiconductor chip of the type having a memory that is protected by a combination of hardware and software mechanisms such that unauthorized access to the data stored in the memory is prevented. The monolithic semiconductor chip comprises a plurality of solder bumps for attaching the chip to a substrate that may be a printed circuit board or another chip; a multi-level interlaced power and ground lines using minimum geometries; and a detection circuit block for detecting an external trip signal that may be produced by a pre-specified change in an operating condition brought on by unauthorized accessing, or an internal trip signal that may be produced by shorting of power and ground lines or by a change in an oscillator's frequency, also associated with or appurtenant to unauthorized accessing of the secure memory.

U.S. Pat. No. 7,122,899 discloses a method for detecting chip tampering by monitoring an ohmic resistance present between two parts of a conductor layer so that the size of the ohmic resistance can be ascertained and/or a semiconductor region is present in or on a layer forming the dielectric. The conductor layer is structured into a gate contact, a source contact, and a drain contact so that a transistor function or switching function is possible in the semiconductor region. Such a configuration allows an attempt to analyze the circuit integrated in the chip to be detected.

U.S. Pat. No. 6,926,204 discloses a secure electronic device comprising: at least an electronic circuit containing information to be protected, an energy source; at least one sensor capable of measuring a determined physical magnitude and outputting a value representative of this magnitude, means of comparing each value with at least one predefined threshold outputting result signals, a device for protection of information comprising means for triggering destruction of at least part of the circuit using pyrotechnic means, a decision-making logical device capable of activating the protection device after seeing the result signals, firing means capable of priming a local or global pyrotechnic micro-charge using electrical energy permanently stored in the energy source.

U.S. Pat. No. 7,119,703 discloses a sensor circuit and method for defending against tampering with an integrated circuit die that uses metal wire loops to protect the circuitry. In addition, these metal wire loops have several via pairs along their length. One of the vias of the via pair goes to a NAND gate which detects a break in a section of a metal wire loop. A second via of the via pair is used to periodically discharge a metal wire loop to remove residual charge, in preparation for charging the metal wire loop and detecting any uncharged section. A given integrated circuit can have one or more metal wire loops on top of the circuitry to be protected. Each metal wire loop has one or more NAND gates. These outputs of the NAND gates can be fed into OR gates to produce an overall signal which activates an alarm or other security action such as erasure of electrically erasable programmable read only memory (EEPROM).

U.S. Pat. No. 6,970,360 discloses a tamper-proof enclosure for an electrical card, such as a high speed communications card, includes an enclosure in which the card is mounted. The enclosure has a wall with an opening, and a cup member is attached to the wall at the opening. A bus that is connected to the card extends through a passage in the cup member and through the opening in the wall. A security mesh is wrapped around the enclosure. The cup member is filled with liquid resin, which is also coated onto the security mesh. After the resin is cured, the resin in the cup member forms a plug that seals the security mesh from inner pressure when the enclosure is heated to an elevated temperature. The resin is preferably polyamide.

U.S. Pat. No. 7,180,008 discloses a tamper protected printed circuit board assembly including a printed circuit board and a partially enveloping tamper wrap covering the entirety of the top surface of the printed circuit board and a first portion of the bottom surface of the printed circuit board, wherein a second portion of the bottom surface of the printed circuit board is not covered by the tamper wrap is provided. The printed circuit board includes two security trace layers each having two security traces thereon, preferably in a serpentine pattern. The tamper wrap and the security traces together cover and prevent tampering with the electronic circuitry of the printed circuit board.

III. SUMMARY OF THE INVENTION

Disclosed is a system for securing proprietary semiconductor ICs including a target semiconductor IC component; at least one laser diode array disposed adjacent to the target semiconductor IC component and coupled thereto; a power supply coupled to the at least one laser diode array; a sensor for sensing a predetermined parameter operatively coupled to the laser diode array through the power supply; wherein the sensor detects the existence of a predetermined event and as a result of the detection of the predetermined event activates the power supply and energizes the laser diode array, causing the laser diode array to project focused laser energy into the target semiconductor IC component, damaging the target semiconductor IC.

Also disclosed is an integrated circuit including at least one laser diode; at least one target integrated circuit component; the at least one laser diode disposed such that laser energy emitted by the at least one laser diode is launched in the direction of the at least one target integrated circuit component; wherein upon receipt of a predetermined signal the at least one laser diode energizes and projects focused laser energy into the target integrated circuit component damaging the integrated circuit.

Also disclosed is a method for securing semiconductor IC components including monitoring at least one semiconductor IC for the occurrence of a predetermined event; detecting the predetermined event; bombarding at least one target semiconductor IC component with laser energy in response to the detection of the predetermined event.

IV. BRIEF DESCRIPTION OF THE DRAWINGS

In order to describe the manner in which the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings.

FIG. 1 is a block diagram of the chip destruct apparatus.

FIG. 2 illustrated an example embodiment of the chip destruct apparatus incorporated into a semiconductor die.

V. DETAILED DESCRIPTION

Various embodiments are discussed in detail below. While specific implementations of the disclosed technology are discussed, it should be understood that this is done for illustration purposes only. A person skilled in the relevant art will recognize that other components and configurations may be used without departing from the spirit and scope of the invention.

The disclosure relates to a system, apparatus and method for securing proprietary semiconductor ICs. The system includes a target semiconductor IC component and at least one laser diode disposed adjacent to the target semiconductor IC component. A power supply is operatively coupled to the at least one laser diode and a sensor for sensing a predetermined parameter relating to the target semiconductor IC component or other system component is operatively coupled to the laser diode array through the power supply. When the sensor detects the existence of a predetermined event, the system activates the power supply and energizes the laser diode, causing the laser diode to project focused laser energy into the target semiconductor IC component, permanently corrupting data, damaging, warping, melting sublimating or otherwise obliterating the target semiconductor IC and rendering the sensitive information or architecture unretrievable with even the most sophisticated reverse engineering tools.

Figure 1:
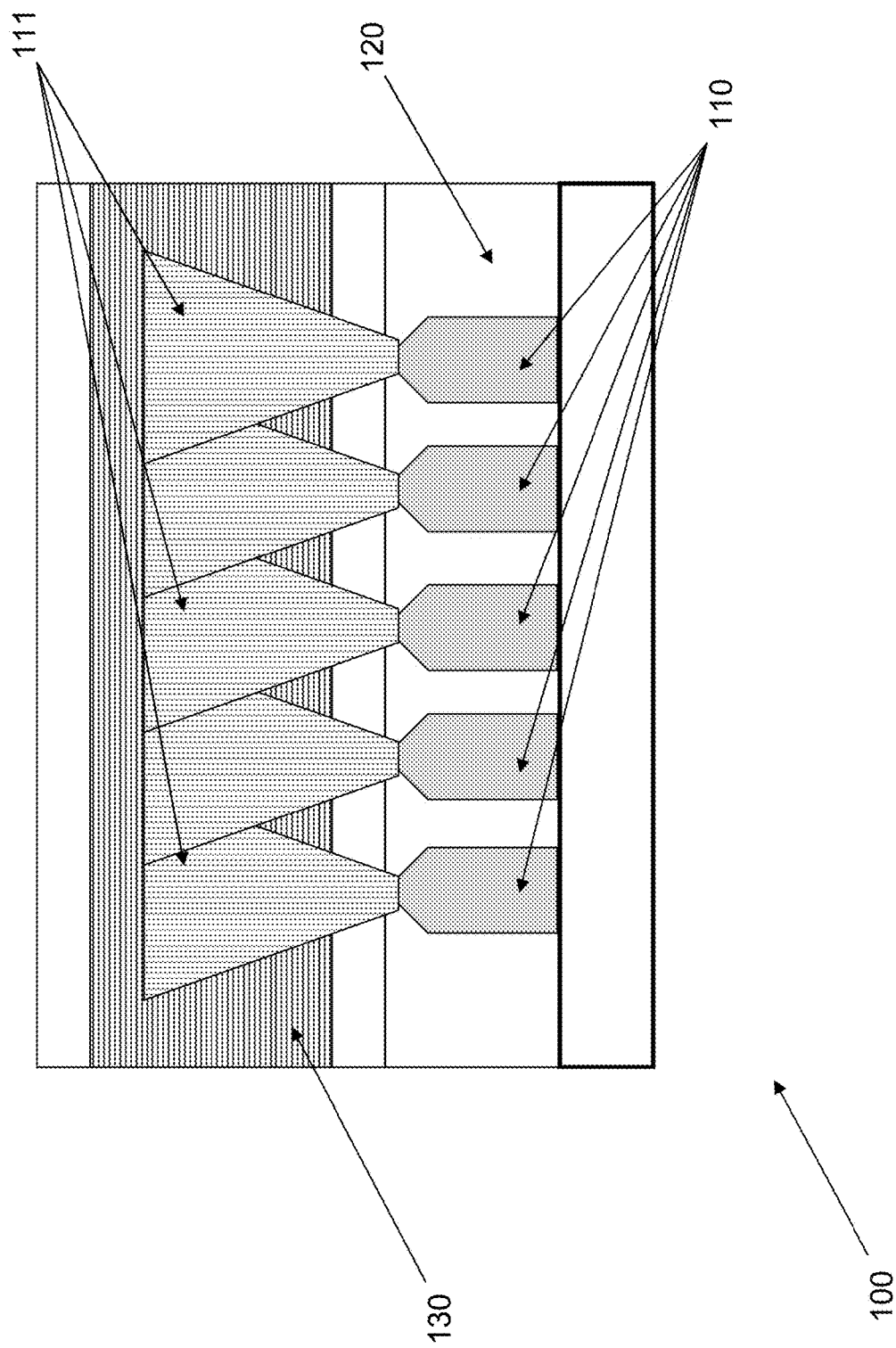

Referring now to the figures wherein like reference numbers denote like elements FIG. 1 show a block diagram of the basic chip destruct apparatus. The chip destruct apparatus shown in FIG. 1 is in the form of a circuit having a plurality of laser diodes 110 and a target integrated circuit component 130. The laser diodes 110 are disposed such that laser energy 111 emitted by the laser diodes 110 is launched in the direction of the target integrated circuit component 130, preferably penetrating the target integrated circuit component 130. Upon receipt of a predetermined signal the laser destruct apparatus implements an autodestruct procedure whereby the laser diodes 110 are energized projecting focused laser energy 111 into the target integrated circuit component 130. The intensity and heat generated by the burst of laser energy projected into the target integrated circuit component 130 damages the target integrated circuit component 130, making reverse engineering of the target integrated circuit component 130, the materials, the architecture and retrieval of the information contained in the target integrated circuit component unachievable. The autodestruct is an extremely short duration process as the operation uses a burst of laser energy having a duration of 0.5 sec. or less. The burst of laser energy may be continuous or pulsed.

In at least one example embodiment the laser diode and the target integrated circuit are incorporated into a common component die structure. Typically the laser diode 110 and the target integrated circuit 130 are incorporated using a stacked configuration with the laser diode 110 disposed in close proximity to the target semiconductor IC 130 to enhance the efficiency of the energy transfer from the laser diode to the target semiconductor IC, and aid in the destruction of the proprietary information embodied in the target semiconductor IC.

To promote destruction of the silicon die, the laser wafer is constructed from a transparent material at the wavelength of operation. The target IC is not transparent, and absorbs much of the photon energy. The energy absorption causes internal over heating and causes the doping in the die to break down. With the applied power from the system, the IC will begin to short out causing the system to enter thermal and current run away which aids in the destruction process. If power is not on or applied then the laser will be the only source of destruction.

Feature size of the bombarded semiconductor IC component is sub-nanometer as the laser chip destruction process typically does not physically break the chip into pieces, rather it photonically bombards the target IC component with significant quantities of radiated energy reducing this section to molten form.

The ability to reverse engineer the die or chip after the destruct event is very difficult due to sublimation of the die. The disclosed invention destroys silicon or other semiconductor materials discreetly at close range up to 4 cm×4 cm or greater in area.

Figure 2:
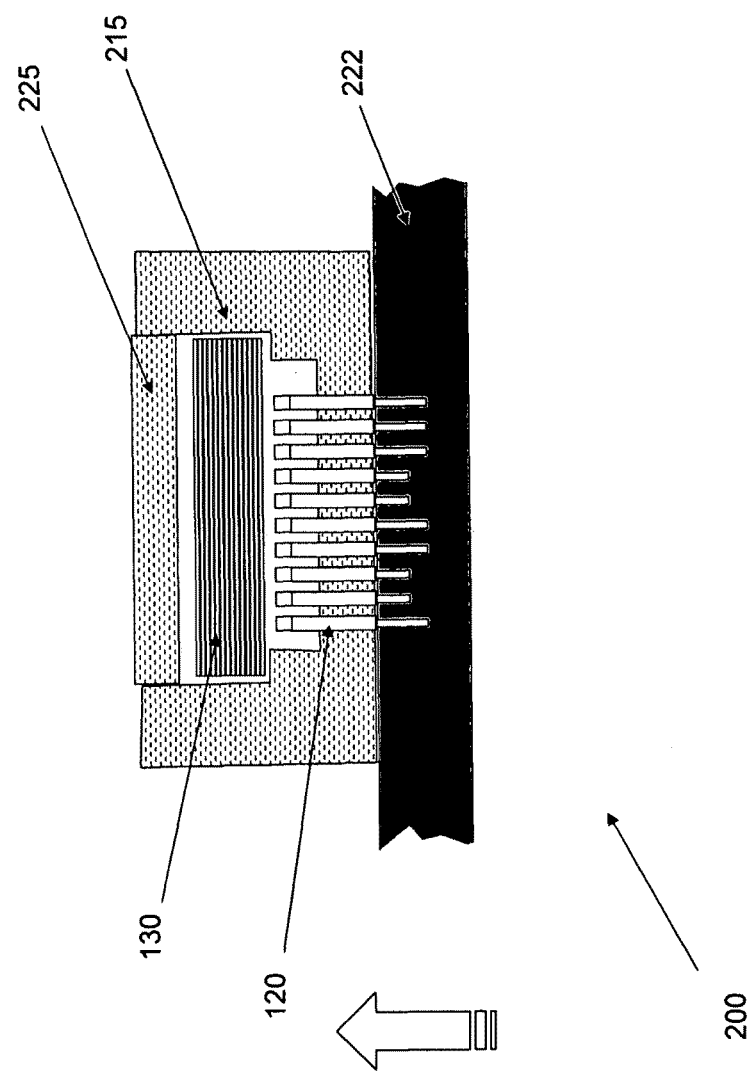

FIG. 2 illustrates an example embodiment of the chip destruct apparatus 100 incorporated into a semiconductor die forming a secure semiconductor IC package 200. Referring to FIG. 2, the secure semiconductor IC package 200 incorporates a die wafer structure packaged with a plurality of diode lasers 110 is disposed on a multilayer substrate 222. The die wafer structure features a wafer package 215 and a wafer lid 225 to seal out the environmental elements and protect the target semiconductor IC 130. The wafer package 215 and wafer lid are typically constructed of a plastic or ceramic material, however other materials may be used.

As shown in the example embodiment of FIG. 2 the chip destruct apparatus 200 includes the laser diode 110 and the target semiconductor IC component's die wafer 130 disposed in a stacked configuration where the target semiconductor IC component's die wafer 130 is disposed directly above the laser diodes 110 within the semiconductor die package 215. Upon the detection of a predetermined event the laser diodes 110 are energized. The laser diode 110 launches laser energy up into the target semiconductor IC component's die wafer 130 destroying the secure semiconductor IC 200. The laser diode 110 may be an integrated semiconductor laser diode containing the laser's pump in an integrated unit or it may require a separate pumping apparatus. The laser diode 110 may also be in the form of a hybrid silicon laser.

The predetermined event can be a tamper event affecting the secure semiconductor IC, an event affecting a circuit card, or any component coupled to the system. The predetermined event may also be the detection of a signal from an operator, or any other sensor coupled to the system.

In yet another embodiment the invention resides in a system for securing proprietary semiconductor ICs comprising a target semiconductor IC, and at least one laser diode array disposed adjacent to said target semiconductor IC component and coupled thereto. The system also includes a power supply coupled to at least one laser diode array and a sensor for sensing a predetermined parameter operatively coupled to said laser diode array through said power supply.

The sensor detects the existence of a predetermined event and as a result of the detection of said predetermined event activates said power supply and energizes said laser diode array, causing said laser diode array to project focused laser energy into said target semiconductor IC component, damaging the target semiconductor IC.

Figure 3:
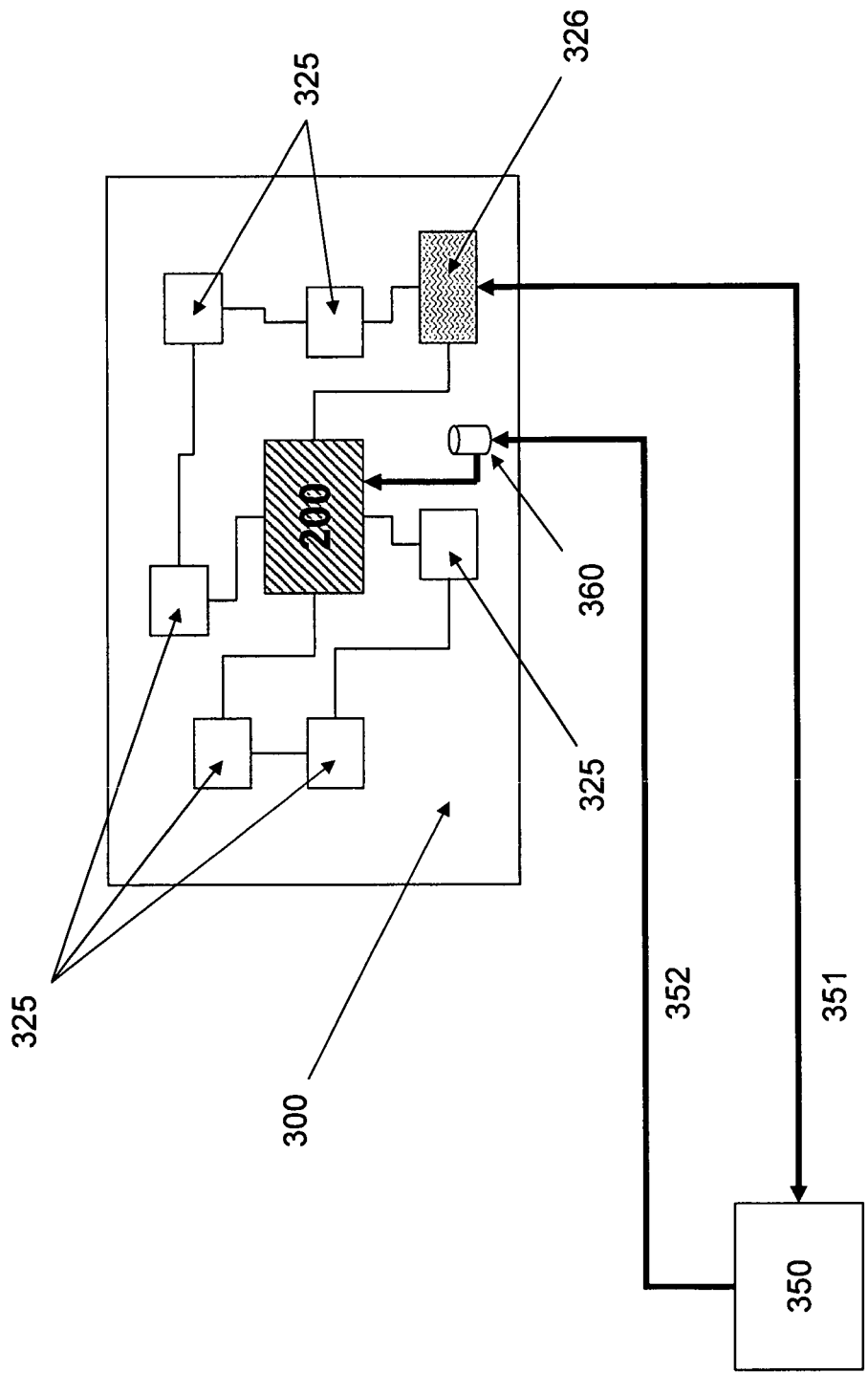
FIG. 3 illustrates an exemplary embodiment of a system employing the chip destruct apparatus in the form of a single secure semiconductor IC disposed on a printed circuit card.

FIG. 3 illustrates a exemplary embodiment of a system employing the chip destruct apparatus in the form of a single secure semiconductor IC 200 on a printed circuit card 300. With reference to FIG. 3 and continued reference to FIG. 2, the secure semiconductor IC 200 is disposed on printed circuit card 300 with a plurality of other semiconductor ICs or semiconductor components 325, 326. As shown in the example embodiment of FIG. 3 the exemplary embodiment features a power supply 360 coupled to the secure semiconductor IC 200. The power supply can be an independent power supply, such as a battery, isolated from the greater circuit, or it can be shared with other components on the card. In other embodiments the power supply may be integrated into the secure semiconductor IC. Typically the power supply is in the form of a battery or a super capacitor, however other components may be employed. With continued reference to FIG. 3 the system also includes a sensor and control unit 350, operatively coupled 352 to the secure semiconductor IC 200 through power supply 360.

In the exemplary embodiment of FIG. 3 a plurality of the components 325, 326 on the circuit card are typically linked 351 to the sensor and control unit 350, such that the sensor and control unit is able to detect a tamper event affecting any of the components linked to the sensor and control unit 350. Upon detection of a tamper event affecting one of the linked components 326, the sensor and control unit 350 activates the power supply 360 charging the laser diodes causing the laser diode contained in the secure semiconductor IC to project focused laser energy into the target semiconductor IC component, damaging said target semiconductor IC component and making the information, architecture or materials of the secure semiconductor IC irretrievable. The photonic energy destroys the target chip and renders the target chip inoperative. The chip destruct sequence may be activated by tamper detection devices, remotely via RF or other similar signal, time delay, submersion in water, manually or any sensor means detecting some predetermined event.

Control unit 350 is coupled to a plurality of components on the circuit card 300 including the secure semiconductor IC 200 and upon detecting a predetermined event affecting either of the monitored components on the circuit card or the removal of the circuit card sensor and control unit 350 activates the laser diodes 110 contained within the secure semiconductor IC 200 destroying the secure semiconductor IC 200. Control unit 350 can be disposed on the circuit card 300, in the greater system or on the secure semiconductor IC 200.

The sensor and control unit 351 may be embodied in a single unit as shown in FIG. 3 or may be embodied in multiple components directly or indirectly coupled to the secure semiconductor IC 200. The laser die destruct may be activated and monitored by a variety of methods including JTAG Boundary Scan and other analog, digital or mixed signal techniques.

The laser diode 110 may be part of a plurality of laser diodes integrated into a single laser diode array 120. The laser diode array 120 may also be incorporated into a laser die and the target IC component 130 also incorporated into a die wherein the laser die and the target IC component die are stacked into a single secure die structure 200. Typically the laser array is incorporated into the architecture of the chip so the existence of this security feature is difficult to detect.

Figure 4:
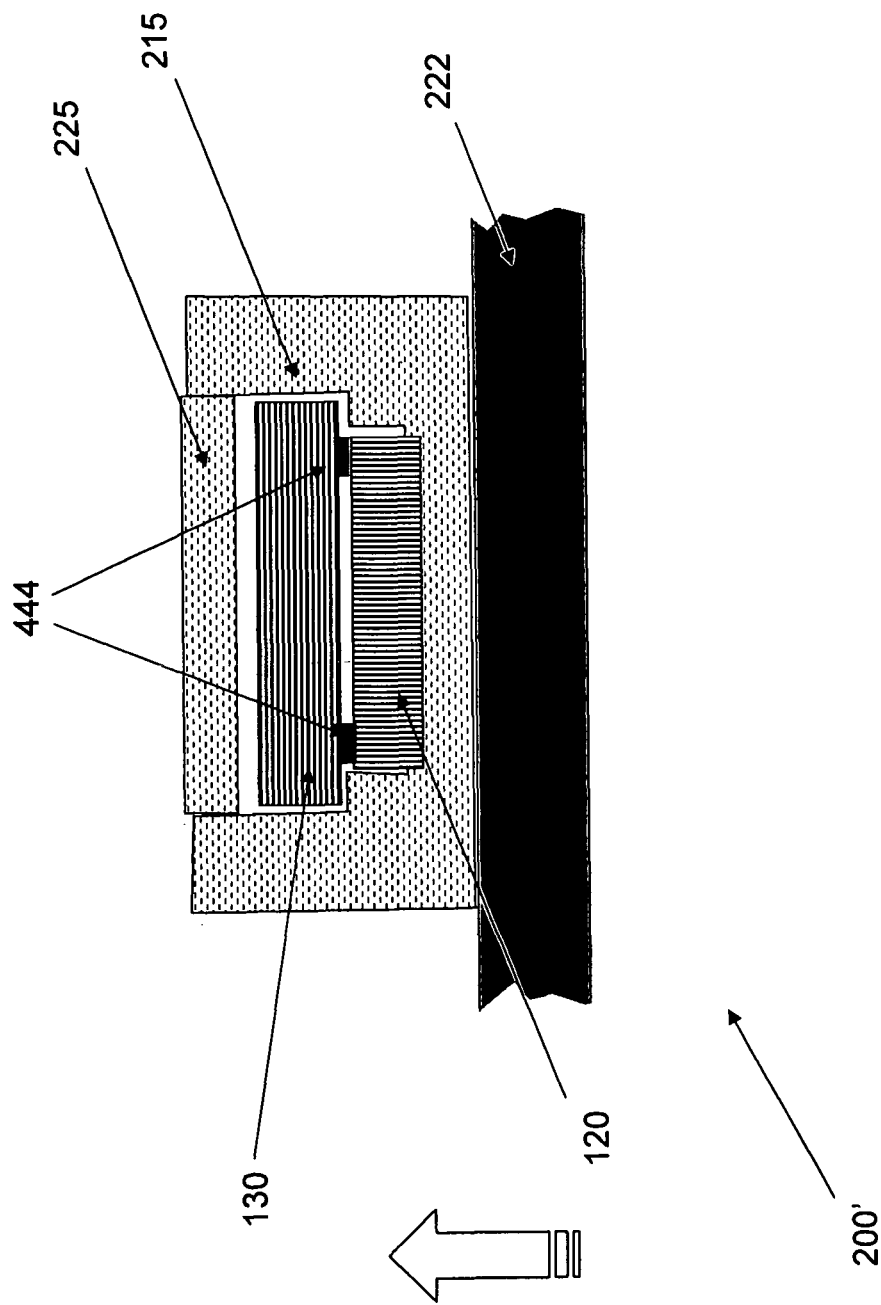
FIG. 4 illustrates an example embodiment of the chip destruct apparatus incorporated into a semiconductor die employing a laser array disposed in a cavity below the target IC configured to bombard the target IC with laser energy from below.

FIG. 4 illustrates an exemplary embodiment of the chip destruct apparatus incorporated into a semiconductor die employing a laser array disposed in a cavity below the target IC configured to bombard the target IC with laser energy from below.

Referring to FIG. 4, the secure semiconductor IC package 200' incorporates a die wafer structure packaged with a laser diode array 120 disposed on a multilayer substrate 222. The die wafer structure features a wafer package 215 and a wafer lid 225 to seal out the environmental elements and protect the target semiconductor IC component 130. The wafer package 215 and wafer lid are typically constructed of plastic or ceramic material, however other materials may be used. In this example embodiment exact orientation of the target semiconductor IC component 130 and the laser diode array 120 is maintained by the use of bond points 444. This feature contributes to the robustness to the secure design, allowing the exact spacing between the semiconductor IC component 130 and the laser diode array 120 to be maintained when the secure semiconductor IC package is employed in systems subject to shock or vibration.

Similar to the example embodiment of FIG. 2, the example embodiment of FIG. 4 employs a stacked configuration. The secure semiconductor IC 200' includes the laser array 120 and the target semiconductor IC component's die wafer 130 disposed in stacked configuration. The target semiconductor IC component's die wafer 130 is disposed directly above the laser array 120 within the semiconductor die package 215. Upon the detection of a predetermined event the laser diodes 110 forming the laser diode array 120 are energized. The laser diodes of the laser array 120 launch laser energy up into the target semiconductor IC component's die wafer 130 destroying the secure semiconductor IC 200'. The laser diode array 120 may include a plurality of integrated semiconductor laser diodes containing the laser array pump in an integrated unit or it may require a separate pumping apparatus. The laser diodes forming the array 120 may also be in the form of hybrid silicon lasers.

Figure 5:
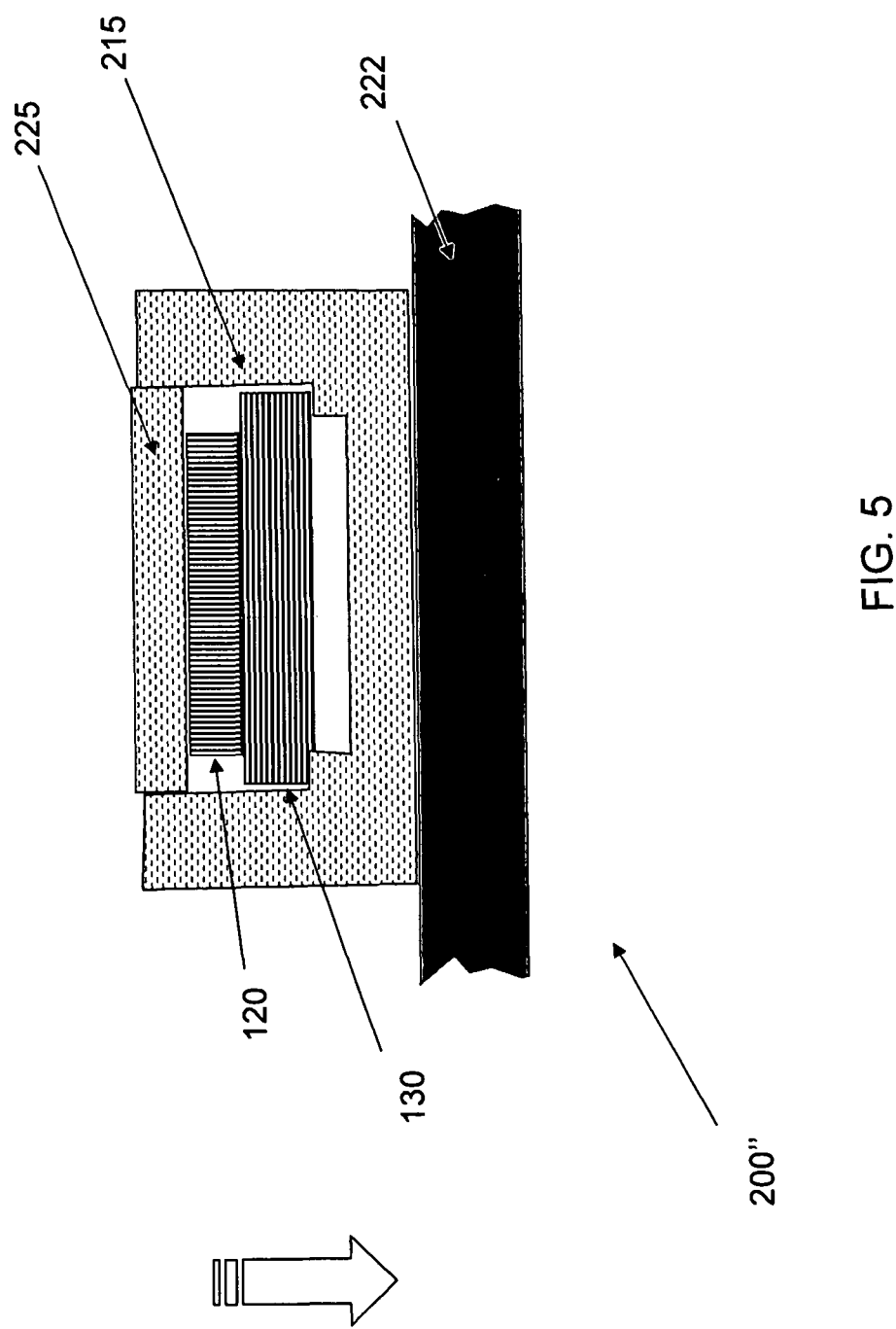
FIG. 5 illustrates an example embodiment of the chip destruct apparatus incorporated into a semiconductor die employing a laser array disposed on top of the target IC configured to bombard the target IC with laser energy from above.

FIG. 5 illustrates yet another example embodiment of the chip destruct apparatus 100 incorporated into a semiconductor die 200" employing a laser array 120 disposed on top of the target semiconductor IC component 130 configured to bombard the target IC with laser energy from above. Similar to the example embodiment of FIG. 4, the example embodiment of FIG. 5 employs a stacked configuration. The secure semiconductor IC 200" includes the laser array 120 and the target semiconductor IC component's die wafer 130 disposed in stacked configuration. The target semiconductor IC component's die wafer 130 is disposed directly below the laser array 120 within the semiconductor die package 215. Upon the detection on a predetermined event the laser forming the laser array 120 are energized. The laser diodes of the laser array 120 launch laser energy down into the target semiconductor IC component's die wafer 130 destroying the secure semiconductor IC 200".

In yet another embodiment the invention resides in a system for securing proprietary semiconductor ICs comprising a target semiconductor IC, and at least one laser diode array disposed adjacent to said target semiconductor IC component and coupled thereto. The system also includes a power supply coupled to at least one laser diode array and a sensor for sensing a predetermined parameter operatively coupled to said laser diode array through said power supply.

Figure 7:
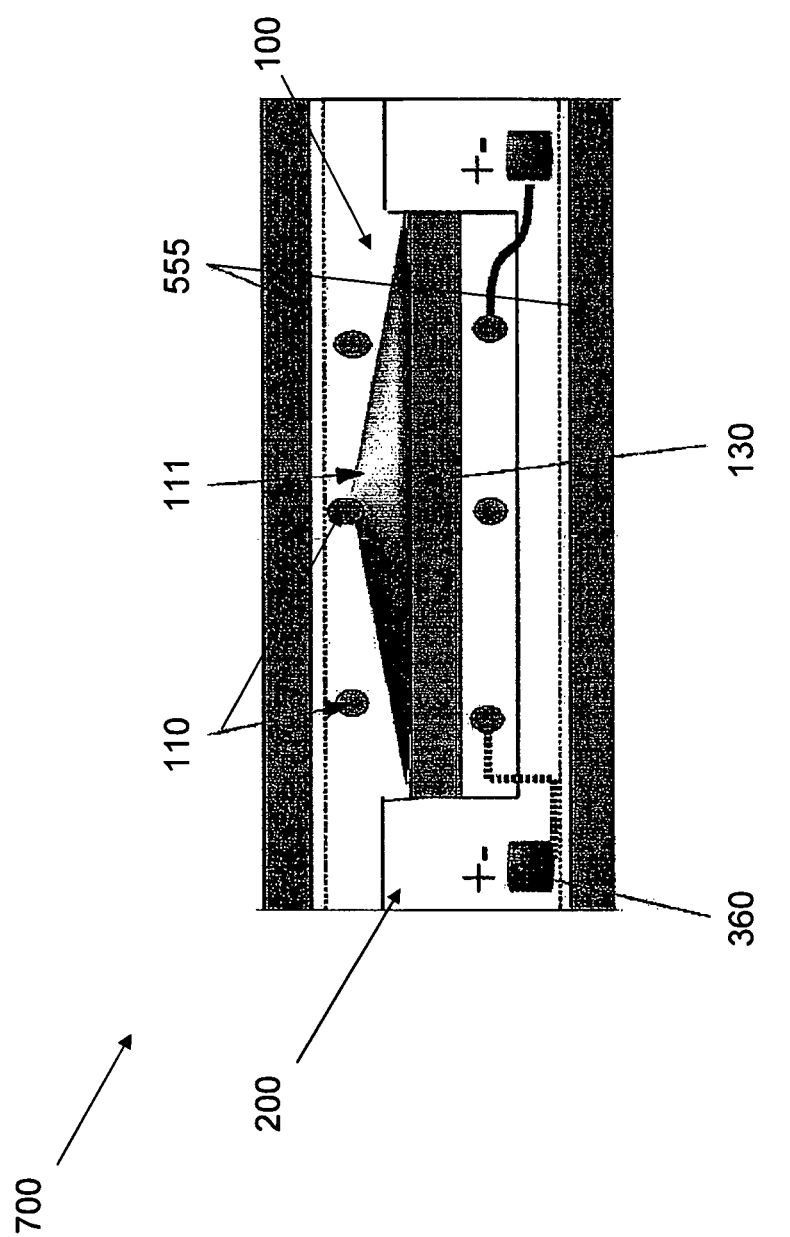
FIG. 7 illustrates an example embodiment of a system for securing a semiconductor IC featuring tamper sense and detection devices incorporated into a target semiconductor IC providing integrated tamper protection to the semiconductor die structure.

FIG. 7 illustrates an example embodiment of a system 700 for securing proprietary semiconductor ICs having tamper sense and detection devices 555 incorporated into a target semiconductor IC 200 with the laser destruct apparatus 100 providing integrated tamper protection to the semiconductor die structure.

In the example embodiment of FIG. 7 the sensors 555 are incorporated in the semiconductor die structure providing top, bottom and side protection for the target semiconductor IC 130. A tamper event affecting either approach to the target semiconductor IC 130 can be detected.

The sensors 555 detect the existence of a predetermined event and as a result of the detection of said predetermined event activates said power supply 360 energizing said plurality of laser diodes 110 or laser diode array, causing said laser diodes 110 to project focused laser energy 111 into said target semiconductor IC component 130, damaging said target semiconductor IC 200.

Chip destruction triggering mechanisms can be selected from multimode sensors including pressure sensor devices, fluid sensor devices, voltage and/or current sensing triggers, RF and other mechanisms as required by the desired triggering logic.

Typically the laser diode array comprises a plurality of hybrid semiconductor lasers, e.g. Indium phosphate and silicon however other types of semiconductor lasers are possible and do not depart from the scope of this invention. The laser diode array is incorporated into a laser die and said target semiconductor IC component is incorporated into a second die and said laser die and target IC component die are stacked into a single secure die structure. The diode array is selected with the appropriate wavelength (e.g. 810 nm) and power availability (a desired milliwatts threshold level and onrush current rate internal IC packaged; [2-4] watts threshold level and onrush current rate external positioned) to cause substantial damage to the individual die selected for the secure die structure. The power supply coupled to the laser diode may or may not be self contained.

In addition to standard laser diodes dies, hybrid laser diode hardware may be employed that enable Raman Effect 4× gain with added PIN Diode capability for die destruct. The autodestruct is an extremely short duration process as the operation just uses a burst of energy for 0.5 sec or less, as such but currently requires a shunt current approaching 120 mA. This can easily be provided by the on-board power supply for FPGA/ASIC/memory applications. However, this leaves open the possibility that such an add-on device could itself be vulnerable to exploitation when confronted by a well equipped reverse engineer. To achieve the power isolation, supercapacitors, or other known components and structure, may be implemented using various materials in a variety of size configurations. Longer duration photonic bombardment of the target IC component.

Different wavelength COTS laser diodes between the IR to visible violet and ultraviolet wavelengths may be used. This wavelength flexibility enables one to evaluate which emission frequency will efficiently destroy a particular die configuration and can be based on materials, environment or power and energy management considerations.

In yet another embodiment the system further comprises a plurality of semiconductor IC coupled to a circuit card assembly, the sensor detecting a predetermined event relating to a semiconductor IC coupled to the circuit card assembly and activates said power supply, energizing said laser diode array and damaging said target semiconductor IC. The system also typically includes a plurality of semiconductor IC coupled to a plurality of circuit card assemblies said circuit card assemblies contained in at least one housing forming a secure structure of semiconductor IC components, wherein said sensor detects a predetermined event affecting the secure structure and activates said power supply, energizing the laser diode array and damaging said target semiconductor IC.

Figure 6:
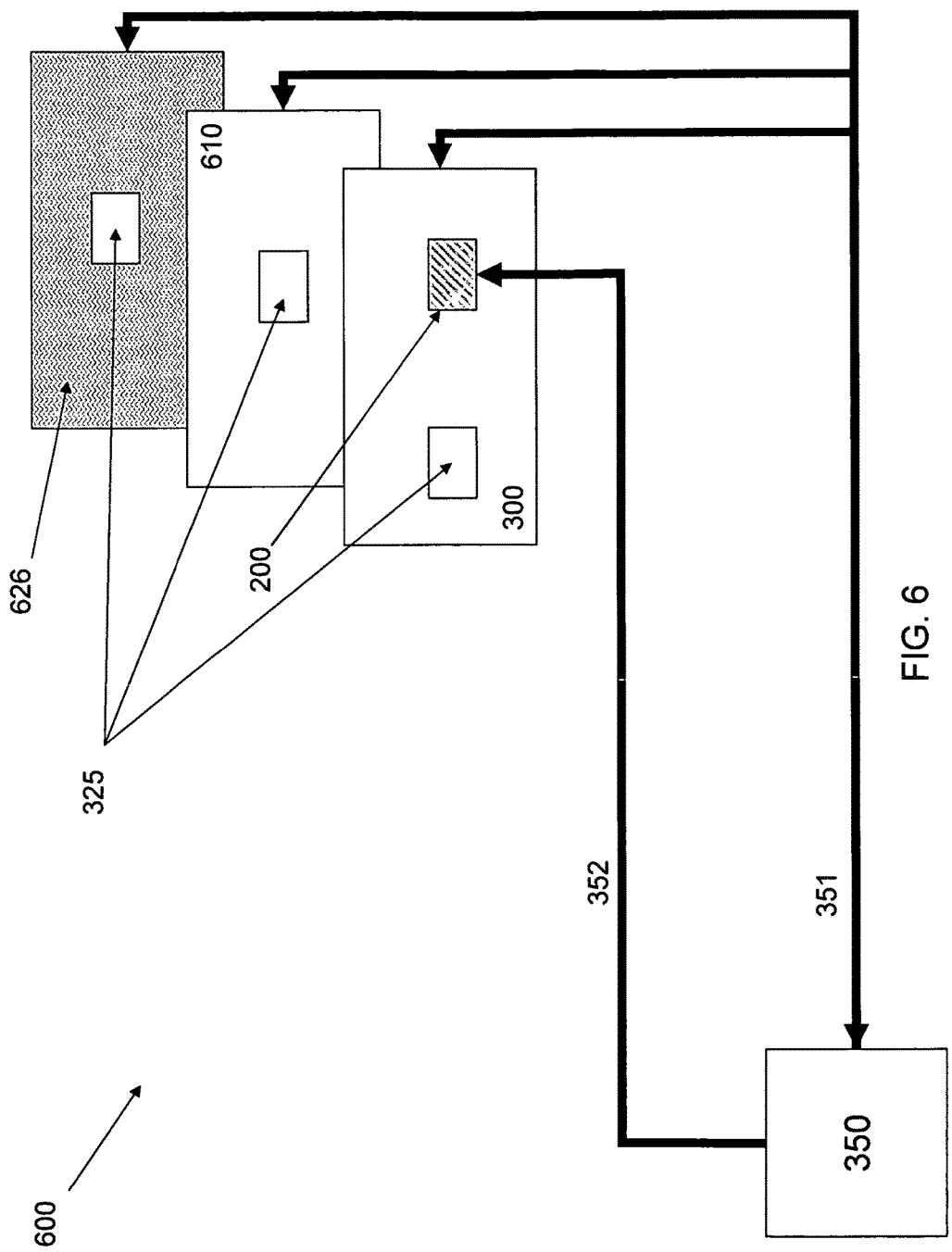
FIG. 6 illustrates an example embodiment of a system employing the chip destruct apparatus in a secure assembly including a plurality of circuit cards.

FIG. 6 illustrates an example embodiment of a system employing the secure semiconductor IC 200 in a secure assembly 600 including a plurality of circuit cards. In the example embodiment of FIG. 6 a secure semiconductor IC 200 is disposed on a circuit card 300 with other IC components 325 coupled 351 to a sensor and control unit 350 such that the sensors of the sensor and control unit 350 are able to detect a tamper event affecting the circuit card 300. The secure assembly 600 includes other circuit cards 610, 626 having IC components 325 thereon also coupled 351 to the sensor and control unit 350 such that the sensors of the sensor and control unit 350 are able to detect a tamper event affecting one or more circuit cards 626, 610 of the secure assembly. The tamper event may be the loss of power to one or more components of one of the circuit cards, the removal of a circuit card or component thereon, the opening of the housing containing on or more of the circuit card, a change in the environmental conditions, i.e. submersion in water, exposure to extreme heat, x-ray energy etc., or other predetermined event.

Upon the detection of a predetermined event, for example the loss of power to circuit card 626, the sensor and control unit 350 activates the power supply of the secure semiconductor IC 200 energizing the laser diode array, causing said laser diode array to project focused laser energy into said target semiconductor IC component, destroying the secure semiconductor IC 200. The laser die destruct may be activated and monitored by a variety of methods including JTAG Boundary Scan and other analog, digital or mixed signal techniques as well as manually.

When employing the JTAG Boundary Scan technique, the system monitors a plurality of selected parameters relating to the components disposed on a circuit card assembly. Upon the detection of a tamper event, or on the onset of a self destruct event the JTAG technique allows the system to issue a system wide destruct order, destroying all of the secure semiconductor IC's on the circuit card assembly. When a system comprising a plurality of circuit cards such as shown in FIG. 6, are monitored using the JTAG or other analog/digital or mixed signal monitoring techniques, a tamper event affecting one of the monitored cards, or a monitored chips may result in activation of the chip destruction sequence across the entire system. This feature allows the system to issue destruct commands for secure semiconductor IC components across a plurality of cards destroying all of the sensitive information system wide on the detection of a single predetermined event.

The disclosed invention can take the form of an entirely hardware embodiment, or an embodiment containing both hardware and software elements. In at least one embodiment, the invention is implemented in software, which includes but is not limited to firmware, resident software, microcode, etc.

Although specific example embodiments have been illustrated and described herein, those of ordinary skill in the art appreciate that other variations, aspects, or embodiments may be contemplated, and/or practiced without departing from the scope or the spirit of the appended claims. The disclosed invention features various embodiments employing external and/or internally embedded destruct diodes relative to device packaging and may be used in any standard or custom packaging.

For example rather than employing a stacked configuration the semiconductor die structure may incorporate a plurality of semiconductor laser arrays configured to project laser energy into a target semiconductor component for a horizontal position or a combination of horizontal and vertical positions to ensure the efficient destruction of the target semiconductor component depending on the target semiconductor IC components position location in the die package.

The invention claimed is:

1. An integrated circuit comprising:
   at least one laser diode;
   at least one target integrated circuit component;
   said at least one laser diode disposed such that laser energy emitted by said at least one laser diode is launched in the direction of said at least one target integrated circuit component;
   wherein upon receipt of a predetermined signal said at least one laser diode energizes and projects focused laser energy into said target integrated circuit component damaging said target integrated circuit component.

2. The device of claim 1 wherein said at least one laser diode and said at least one target integrated circuit are incorporated into a component die structure.

3. The device of claim 2 wherein said laser diode is an integrated semiconductor laser diode.

4. The device of claim 2 wherein said laser diode is a hybrid silicon laser.

5. The device of claim 2 wherein said at least one laser diode is incorporated into a laser diode array.

6. The device of claim 5 wherein said laser diode array is incorporated into a laser die and said target IC component is incorporated into a die and said laser die and target IC component die are stacked into a single secure die structure.

7. The device of claim 6 wherein the wafer from which said laser die is constructed from is transparent at the laser's wavelength.

8. A system for securing proprietary semiconductor ICs comprising:
a target semiconductor IC including a target semiconductor IC component;
at least one laser diode array disposed adjacent to said target semiconductor IC component and coupled thereto;
a power supply coupled to said at least one laser diode array;
a sensor for sensing a predetermined parameter operatively coupled to said laser diode array through said power supply;
wherein said sensor detects the existence of a predetermined event and as a result of the detection of said predetermined event activates said power supply and energizes said laser diode array, causing said laser diode array to project focused laser energy into said target semiconductor IC component, damaging said target semiconductor IC.

9. The system of claim 8 wherein said laser diode array comprises a plurality of hybrid semiconductor lasers.

10. The system of claim 8 wherein said laser diode array is incorporated into a laser die and said target semiconductor IC component is incorporated into a second die and said laser die and target IC component die are stacked into a single secure die structure.

11. The system of claim 8 wherein said power supply coupled to said laser diode is self contained.

12. The system of claim 8 further comprising a plurality of semiconductor ICs coupled to a circuit card assembly, said sensor detecting a predetermined event relating at least one of said plurality of semiconductor ICs and said target semiconductor IC and activating said power supply, energizing said laser diode array and damaging said target semiconductor IC.

13. The system of claim 8 further comprising a plurality of semiconductor ICs coupled to a plurality of circuit card assemblies said circuit card assemblies contained in at least one housing forming a secure structure of semiconductor IC components, wherein said sensor detects a predetermined event affecting said secure structure and activates said power supply, energizing said laser diode array and damaging said target semiconductor IC.

14. A method for securing a semiconductor IC, said semiconductor IC including at least one semiconductor IC component comprising the steps of:
monitoring at least one semiconductor IC for the occurrence of a first predetermined event;
detecting said first predetermined event;
bombarding at least one target semiconductor IC component with laser energy in response to the detection of said first predetermined event.

15. The method of claim 14 further comprising:
damaging said at least one target semiconductor IC component with said laser energy.

16. The method of claim 15 further comprising:
monitoring a housing comprising a plurality of semiconductor ICs for the occurrence of a predetermined event relating to said housing;
detecting said predetermined event;
bombarding at least one target semiconductor IC component with laser energy in response to the detection of said predetermined event relating to said housing.

17. The method of claim 14 further comprising:
coupling a plurality of semiconductor ICs into a circuit card assembly;
monitoring said circuit card assembly for a predetermined event relating to said circuit card assembly;
bombarding at least one target semiconductor IC component of a circuit card assembly in response to the detection of said predetermined event relating to said circuit card assembly.

18. The method of claim 17 further comprising:
monitoring at least one semiconductor IC of said secure circuit card assembly for a predetermined event relating said circuit card assembly;
bombarding at least one target semiconductor IC component of said circuit card assembly in response to the detection of said predetermined event relating to said circuit card assembly.

19. The method of claim 14 further comprising:
coupling a plurality of semiconductor IC components into at least one secure circuit card assembly;
coupling a plurality of circuit card assemblies into at least one housing forming a secure structure of semiconductor IC components;
monitoring at least one housing containing a semiconductor IC component for a predetermined event;
bombarding at least one target semiconductor IC component of said secure structure in response to the detection of said predetermined event.

20. The method of claim 19 further comprising:
monitoring at least one circuit card containing a semiconductor IC component for a predetermined event.

21. The method of claim 14 wherein said at least one semiconductor IC includes said target semiconductor IC component.

22. A tamper resistant integrated circuit assembly comprising:
a die housing;
a die wafer disposed within said die housing;
a laser diode array opposing said die wafer and disposed in stacked configuration with said die wafer;
said laser diode array irradiating said die wafer with a burst of laser energy sufficient to corrupt said die wafer responsive to signal indicative of the occurrence of a predetermined event.

23. The tamper resistant integrated circuit assembly of claim 22 wherein said laser diode array is disposed in a laser wafer comprising a material that is transparent at a wavelength of laser operation and said die wafer is constructed of a material that is not transparent.

24. The tamper resistant integrated circuit assembly of claim 22 wherein said die wafer is disposed directly above said laser diode array.

25. The tamper resistant integrated circuit assembly of claim 22 wherein said laser diode array is disposed directly above said die wafer.

* * * * *